(12) United States Patent
Lee et al.

(10) Patent No.: US 7,221,227 B2
(45) Date of Patent: May 22, 2007

(54) METHODS AND APPARATUS FOR REDUCING OUTPUT CURRENT OSCILLATIONS OF A DRIVER PROVIDED WITH CIRCUITRY THAT SENSES AND RESPONDS TO EXCESSIVE CURRENT DRAWS OF AN OUTPUT STAGE OF THE DRIVER

(75) Inventors: Kah Weng Lee, Singapore (SG); Bin Zhang, Singapore (SG)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 151 days.

(21) Appl. No.: 11/147,795

(22) Filed: Jun. 6, 2005

(65) Prior Publication Data

US 2006/0273858 A1 Dec. 7, 2006

(51) Int. Cl.
*H03F 1/52* (2006.01)
(52) U.S. Cl. .................. 330/298; 330/283; 330/296
(58) Field of Classification Search ............... None
See application file for complete search history.

(56) References Cited

U.S. PATENT DOCUMENTS 4,755,741 A * 7/1988 Nelson .................. 330/296
5,397,978 A 3/1995 Parry et al.
6,563,385 B2 * 5/2003 Wojslaw ................ 330/296

FOREIGN PATENT DOCUMENTS

| EP | 0 639 894 A1 | 2/1995 |
| EP | 0 647 026 A3 | 1/1996 |
| EP | 0 730 347 A3 | 10/1996 |

* cited by examiner

*Primary Examiner*—Khanh Van Nguyen

(57) ABSTRACT

In one embodiment, a method is provided for reducing output current oscillations of a driver provided with i) a current sensing circuit that senses excessive current draws of an output stage of the driver, and ii) a feedback control circuit that reduces the excessive current draws. In accordance with the method, an output of the current sensing circuit is coupled to an input of a common source amplifier with source degeneration. The output of the common source amplifier is coupled to a node between an input stage and an amplification stage of the driver. The common source amplifier is configured to be activated when the current sensing circuit senses an excessive current draw of the output stage, at which time the feedback control circuit is also activated. Related apparatus is also disclosed.

11 Claims, 3 Drawing Sheets

METHODS AND APPARATUS FOR REDUCING OUTPUT CURRENT OSCILLATIONS OF A DRIVER PROVIDED WITH CIRCUITRY THAT SENSES AND RESPONDS TO EXCESSIVE CURRENT DRAWS OF AN OUTPUT STAGE OF THE DRIVER

BACKGROUND

In some situations, a driver is provided with circuitry that senses and responds to excessive current draws of the driver's output stage. However, when such a driver is operated at high speeds, the circuitry can cause oscillations in the driver's output current.

SUMMARY OF THE INVENTION

In one embodiment, a driver comprises a feed-forward circuit path extending from an input stage to an amplification stage to an output stage. The driver also comprises a current sensing circuit that has an input to sense a current draw of the output stage, and an output that is indicative of the current draw exceeding a threshold. A feedback control circuit of the driver has i) a bias transistor that is coupled to a node of the feed-forward circuit path between the input stage and the amplification stage, to bias the feed forward circuit path toward a first potential, ii) a circuit to disable the input stage, and iii) a common source amplifier with source degeneration, an output of which is coupled to the node of the feed-forward circuit path between the input stage and the amplification stage. In operation, the bias transistor, the circuit that disables the input stage, and the common source amplifier are activated when the output of the current sensing circuit is indicative of the current draw exceeding the threshold.

In another embodiment, a method for reducing output current oscillations of a driver provided with i) a current sensing circuit that senses excessive current draws of an output stage of the driver, and ii) a feedback control circuit that reduces the excessive current draws, comprises: 1) coupling an output of the current sensing circuit to an input of a common source amplifier with source degeneration; 2) coupling an output of the common source amplifier to a node between an input stage and an amplification stage of the driver; and 3) configuring the common source amplifier to be activated when the current sensing circuit senses an excessive current draw of the output stage, at which time the feedback control circuit is also activated.

Other embodiments are also disclosed.

BRIEF DESCRIPTION OF THE DRAWINGS

Illustrative embodiments of the invention are illustrated in the drawings, in which.

DETAILED DESCRIPTION

Figure 1:
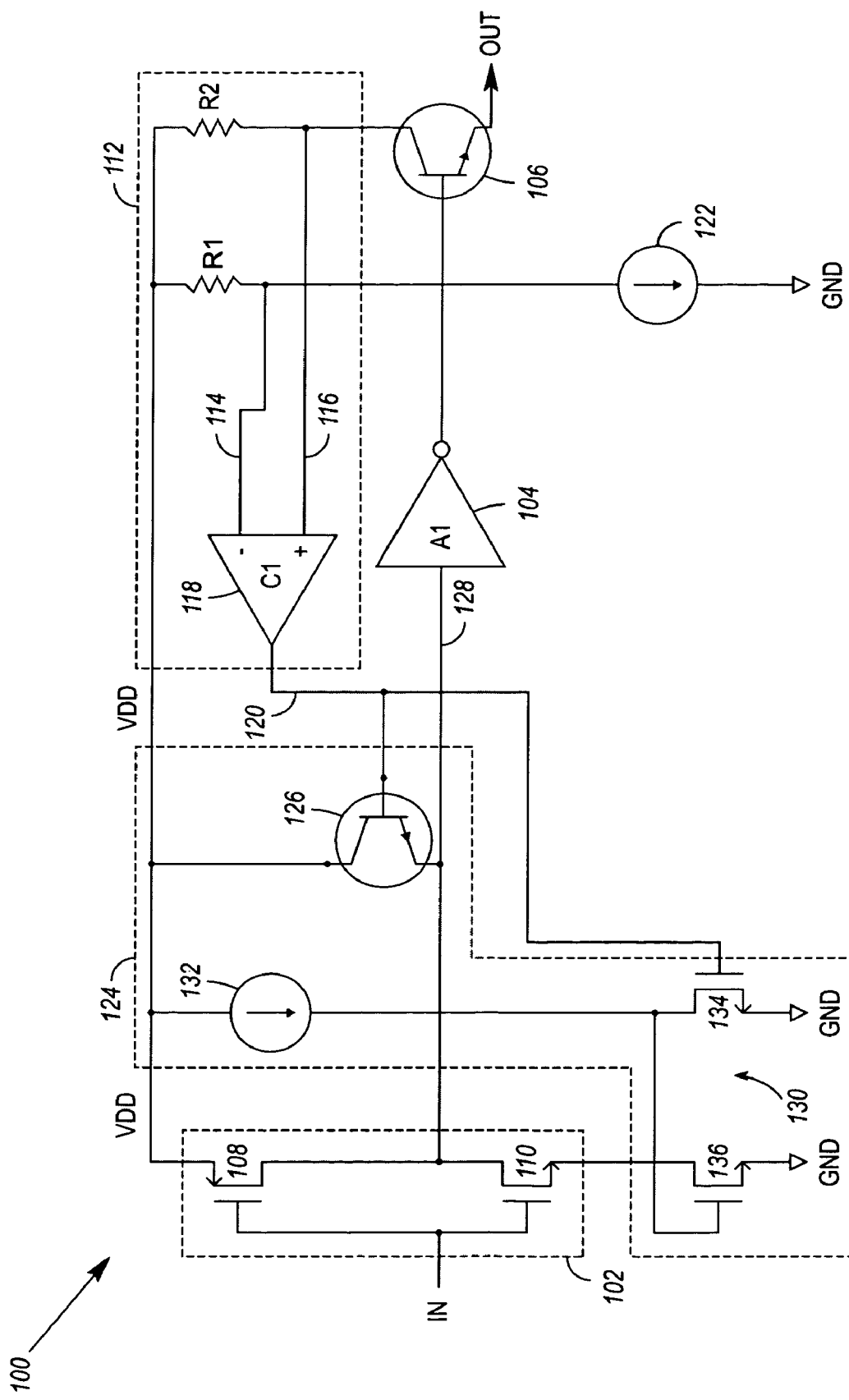
FIG. 1 illustrates an exemplary driver that is provided with circuitry that senses and responds to excessive current draws of an output stage of the driver.

FIG. 1 illustrates an exemplary driver 100 that is provided with circuitry for sensing and responding to excessive current draws of an output stage 106 of the driver 100. More specifically, the driver 100 comprises a feed-forward circuit path that extends from an input stage 102 to an amplification stage 104 to an output stage 106.

By way of example, the input stage 102 is shown to be an inverting, metal-oxide semiconductor buffer comprised of p-channel and n-channel field-effect transistors (FETs) 108, 110 that are coupled in series by means of their source and drain terminals between first and second power rails (i.e., a voltage (VDD) and ground (GND)). The gates of the FETs are coupled to a common input node, IN. The amplification stage 104 may be constructed similarly to the input stage 102.

By way of further example, the output stage 106 may comprise a bipolar transistor. The transistor's base may be connected to the output of the amplification stage 104; the transistor's collector may be coupled to VDD through a resistor R2; and the transistor's emitter may provide the driver's output, OUT.

The driver 100 further comprises a current sensing circuit 112 having an input 116 to sense a current draw of the output stage 106. The current sensing circuit 112 also has an output 120 that is indicative of the sensed current draw exceeding a threshold. The threshold may be programmable or static.

In one embodiment, the current sensing circuit 112 comprises a comparator 118, the inputs 114, 116 of which are respectively coupled to 1) a resistor, R1, that is biased with a first current, and 2) a resistor, R2, through which the current of the output stage 106 is drawn. As shown, the current through the resistor R1 may be set by a current source 122.

The threshold of the current sensing circuit 112 may be adjusted in various ways, including, by adjusting the ratio of the resistors R1 and R2, or by adjusting the current provided by the current source 122.

The driver 100 also comprises a feedback control circuit 124. As shown, the feedback control circuit 124 is provided with a bias transistor 126. The bias transistor is coupled to a node 128 that lies between the input stage 102 and the amplification stage 104. When activated by the current sensing circuit 112, the bias transistor 126 biases the node 128 toward a first potential (e.g., VDD). As shown, the bias transistor 126 may take the form of a bipolar transistor having its collector coupled to VDD, its emitter coupled to the node 128, and its gate coupled to the output 120 of the current sensing circuit 112.

The feedback control circuit 124 further comprises a circuit 130 to disable the driver's input stage 104. As shown, the circuit 130 may take the form of a current steering circuit comprising a current source 132 and FET 134 that are coupled in series between VDD and GND. The current steering circuit may also comprise a FET 136 that is coupled in series with the FETs 108, 110 of the input stage 102. The gate of the FET 134 is coupled to the output 120 of the current sensing circuit 112, and the gate of the FET 136 is coupled to the output of the current source 132. Under normal current draws of the output stage 106, the FET 136 is switched ON so that it couples the FET 110 to GND, and the FET 134 is switched OFF. However, under excessive current draws of the output stage 106, the output 120 of the current sensing circuit 112 causes the FET 134 to conduct, thereby steering current away from the FET 136 and causing limited or no ground return for the FET 110.

Under normal current draws of the output stage 106, the current sensing circuit 112 of the driver 100 produces a low output, and the feedback control circuit 124 has little to no effect on the propagation of signals through the driver's feed-forward circuit path (i.e., from IN to OUT). However, under excessive current draws of the output stage 106 (e.g., when the driver's input, IN, is at a high impedance, and when the driver's output, OUT, is at a low impedance), the current sensing circuit 112 activates the components of the feedback control circuit 124 to reduce the current flow through the output stage 106.

Figure 2:
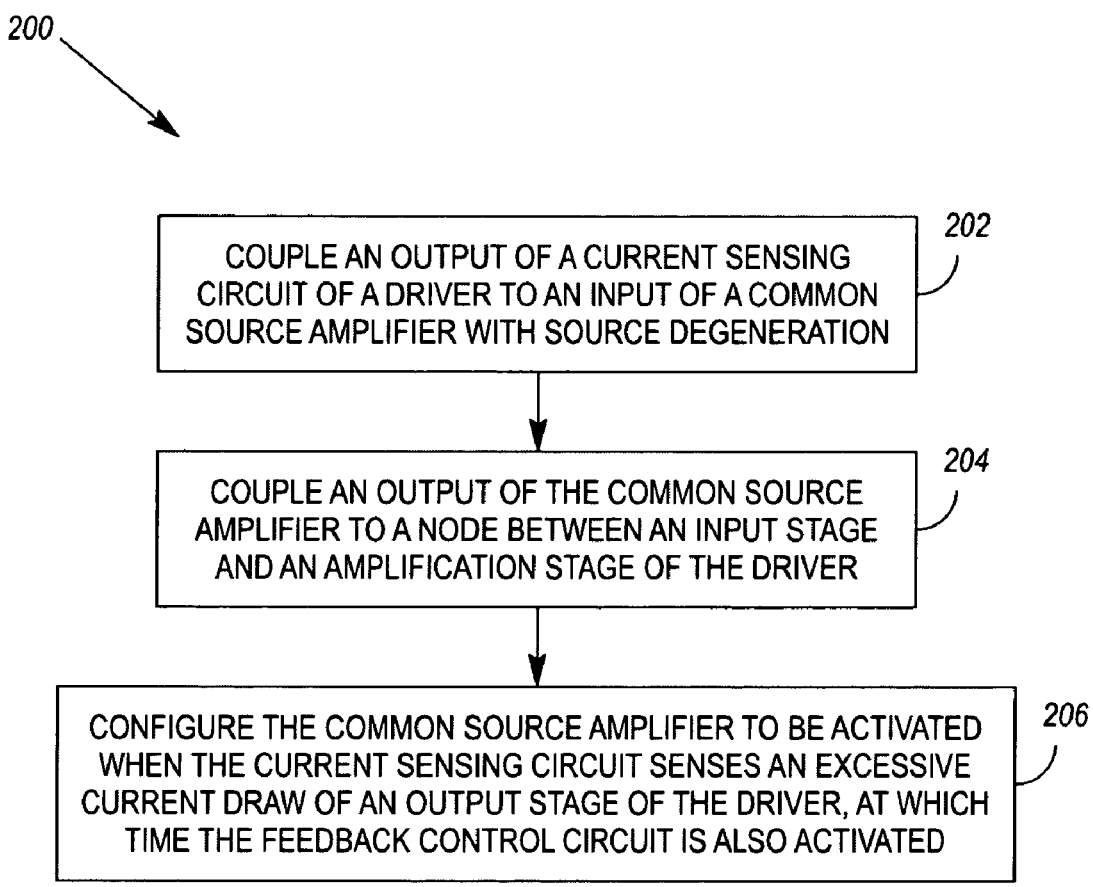
FIG. 2 illustrates an exemplary method for reducing output current oscillations of drivers such as that which is illustrated in FIG. 1.

One problem with the driver 100 is that the feedback control circuit's reduction of current flow through the output stage 106 results in the current sensing circuit's output 120 going low, thereby disabling the feedback control circuit's current reducing effect. However, if the current draw of the output stage 106 is close to exceeding the threshold of the current sensing circuit 112, and again does so, the feedback control circuit 124 will be activated once again. One can therefore appreciate that, under conditions of high output current and high operating speed, the driver's output current will tend to oscillate, which can be undesirable. FIG. 2 therefore illustrates a method 200 for reducing output current oscillations of a driver such as that which is shown in FIG. 1.

In accordance with the method 200, the output of a current sensing circuit such as that which is shown in FIG. 1 is coupled 202 to an input of a common source amplifier with source degeneration. The output of the common source amplifier is then coupled 204 to a node between a driver's input and amplification stages. The common source amplifier is then configured 206 to be activated when the current sensing circuit senses an excessive current draw of the output stage (at which time the feedback control circuit is also activated).

Figure 3:
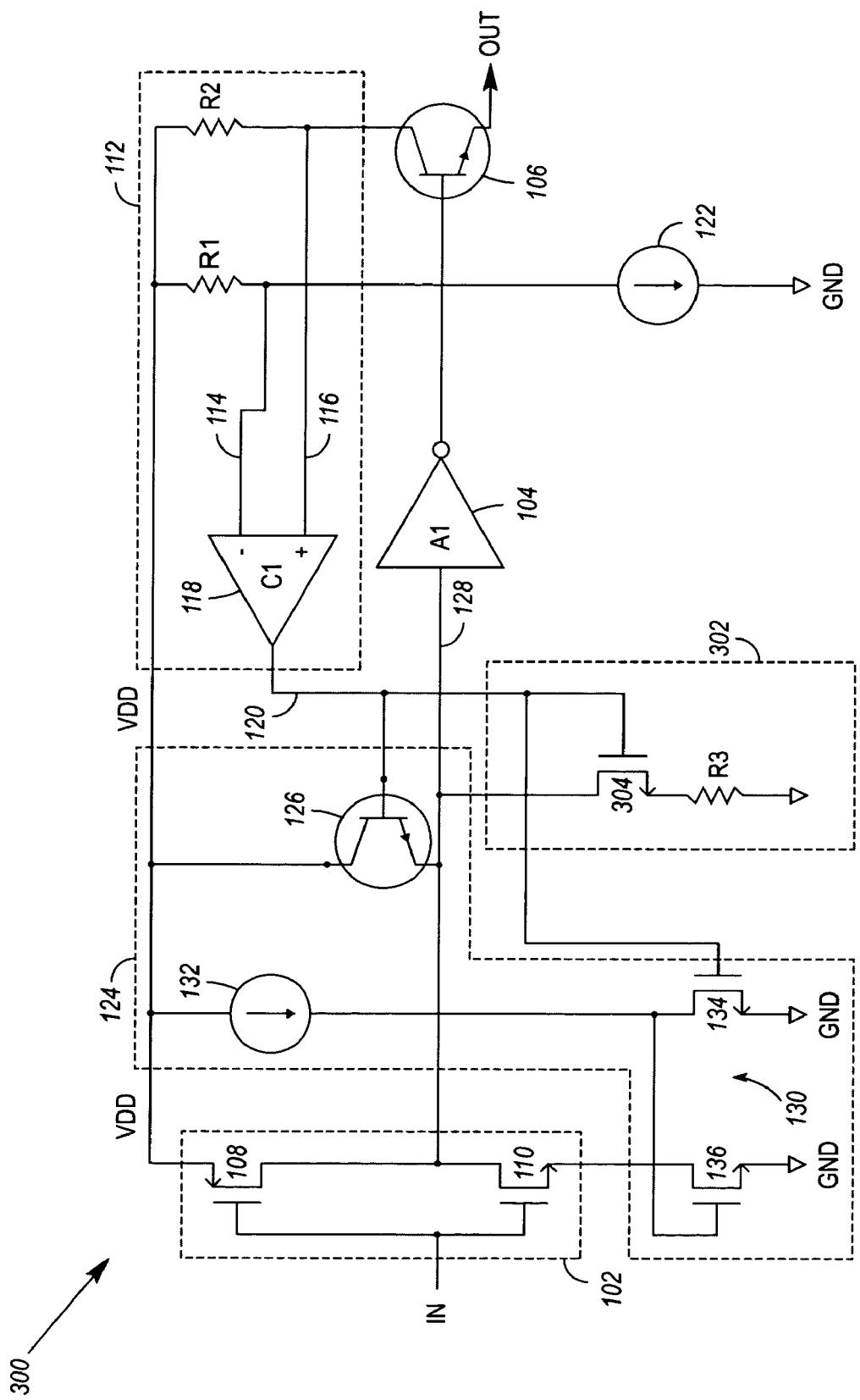
FIG. 3 illustrates the exemplary addition of a common source amplifier with source degeneration to the FIG. 1 driver.

An exemplary application of the method 200 is shown in FIG. 3, which illustrates a driver 300 that is in many ways similar to the driver 100 shown in FIG. 1. Similar components are therefore given similar reference numbers and will not be discussed further.

In addition to the component's provided in the driver 100, the driver 300 comprises a common source amplifier 302 with source degeneration. The common source amplifier 302 has a FET 304, the gate of which is coupled to the output 120 of the current sensing circuit 112. The drain terminal of the FET 304 serves as the common source amplifier's output and is coupled to the node 128. By way of example, the FET's source terminal is coupled to ground via a resistor, R3 (i.e., for resistive source degeneration).

When activated by the output 120 of the current sensing circuit 112, the current source amplifier 302 reduces the gain contributed by the FET 136 and bias transistor 126. The current source amplifier 302 also decreases the impedance seen at the input of the amplification stage 104 (i.e., because the combined impedance of the FET 304 and resistor R3 is added in parallel to the impedance looking into the emitter of the bias resistor 126, and the impedances looking into the drains of FET 108 and FETs 110 and 136). As a result, the phase margin of the driver 300 is increased over that of the driver 100, and the likelihood of any output current oscillation is reduced or eliminated. The common source amplifier 302 also acts as a bleeding path for the bias transistor 126 and clamps the node 128 at a voltage determined by the product of the current through the current source amplifier 302 and the resistance looking into the amplifier 302.

What is claimed is:

1. A driver, comprising:
   a feed-forward circuit path extending from an input stage to an amplification stage to an output stage;
   a current sensing circuit having an input to sense a current draw of the output stage, and an output that is indicative of the current draw exceeding a threshold; and
   a feedback control circuit having i) a bias transistor, coupled to a node of the feed-forward circuit path between the input stage and the amplification stage, to bias the feed-forward circuit path toward a first potential, ii) a circuit to disable the input stage, and iii) a common source amplifier with source degeneration having an output coupled to the node of the feed-forward circuit path between the input stage and the amplification stage;
   wherein the bias transistor, the circuit that disables the input stage, and the common source amplifier are activated when the output of the current sensing circuit is indicative of the current draw exceeding the threshold.

2. The driver of claim 1, wherein the input stage is an inverting, metal-oxide semiconductor buffer.

3. The driver of claim 1, wherein the output stage is a bipolar transistor.

4. The driver of claim 1, wherein the current sensing the driver comprises a comparator, inputs of which are respectively coupled to i) a resistor biased with a first current, and ii) a resistor through which the current of the output stage is drawn.

5. The driver of claim 1, wherein the bias transistor is a bipolar transistor.

6. The driver of claim 1, wherein the collector of the bias transistor is coupled to a power rail, and the emitter of the bias transistor is coupled to the node of the feed-forward circuit path between the input stage and the amplification stage.

7. The driver of claim 1, wherein the common source amplifier comprises resistive source degeneration.

8. The driver of claim 1, wherein:
   the input stage is an inverting, metal-oxide semiconductor buffer;
   the output stage is a bipolar transistor;
   the current sensing circuit comprises a comparator, inputs of which are respectively coupled to i) a resistor biased with a first current, and ii) a resistor through which the current draw of the output stage is fed;
   the bias transistor is a bipolar transistor; and
   the common source amplifier comprises resistive source degeneration.

9. A method for reducing output current oscillations of a driver provided with i) a current sensing circuit that senses excessive current draws of an output stage of the driver, and ii) a feedback control circuit that reduces the excessive current draws, the method comprising:
   coupling an output of the current sensing circuit to an input of a common source amplifier with source degeneration;
   coupling an output of the common source amplifier to a node between an input stage and an amplification stage of the driver; and
   configuring the common source amplifier to be activated when the current sensing circuit senses an excessive current draw of the output stage, at which time the feedback control circuit is also activated.

10. The method of claim 9, wherein the output stage for which a current draw is sensed comprises a bipolar transistor.

11. The method of claim 9, wherein the source degeneration is resistive source degeneration.

* * * * *